(12) United States Patent
Jung

(10) Patent No.: US 6,841,202 B1
(45) Date of Patent: Jan. 11, 2005

(54) DEVICE AND METHOD FOR THE VACUUM PLASMA PROCESSING OF OBJECTS

(75) Inventor: Thomas Jung, Hotzum (DE)

(73) Assignee: Fraunhofer-Gesellschaft zur Forderung, Munich (DE)

( * ) Notice: Subject to any disclaimer, the term of this patent is extended or adjusted under 35 U.S.C. 154(b) by 0 days.

(21) Appl. No.: 09/743,545

(22) PCT Filed: Jul. 28, 1999

(86) PCT No.: PCT/EP99/05409

§ 371 (c)(1),
(2), (4) Date: Mar. 8, 2001

(87) PCT Pub. No.: WO00/08227

PCT Pub. Date: Feb. 17, 2000

(30) Foreign Application Priority Data

Jul. 31, 1998 (DE) .......................................... 198 34 733

(51) Int. Cl.[7] .......................... H05H 1/46; C23C 14/34; C23C 16/06; C23C 16/511; C23C 16/455
(52) U.S. Cl. ........................ 427/575; 427/576; 427/569; 118/723 MW; 118/726; 204/192.15; 204/192.17; 204/298.09; 204/298.12
(58) Field of Search ................................ 427/576, 577, 427/564, 455, 456, 575, 569; 118/723 MW, 723 ME, 723 E, 723 ER, 723 IR, 723 I, 726; 204/192.15, 192.17, 298.06, 298.07, 298.09, 298.12

(56) References Cited

U.S. PATENT DOCUMENTS

| 3,282,816 | A | | 11/1966 | Kay ............................ 204/192 |
| 4,049,523 | A | * | 9/1977 | Boehnke et al. ............ 204/192 |
| 4,090,941 | A | | 5/1978 | Wright et al. ............... 204/298 |
| 4,236,994 | A | * | 12/1980 | Dugdale .................... 204/192 |
| 4,545,881 | A | * | 10/1985 | Shinmi et al. .......... 204/192.15 |
| 4,931,169 | A | * | 6/1990 | Scherer et al. .......... 204/192.11 |
| 5,277,779 | A | | 1/1994 | Henshaw ................ 204/298.21 |
| 5,292,417 | A | * | 3/1994 | Kugler ................... 205/298.08 |
| 5,531,877 | A | * | 7/1996 | Latz et al. .............. 204/298.08 |

FOREIGN PATENT DOCUMENTS

JP          9-241824          *  9/1997

OTHER PUBLICATIONS

Translation of H9–241824 to Takaaki Kitahara et al, Sep. 16, 1997.*
Vacuum Coating (in German), G. Kienel, vol. 2, VDI Verlag GmbH, Dusseldorf, 1995, pp. 160–161, no month.
Effects of Physics (in German), Verlag Harry Deutsch, Thun, Frankfurt/Main, 1990, pp. 160–161, no month.
Derwent Russian Pat Abstract, Mar. 27, 1998 RU 2107970–C1.
Japanese Patent Abstract 09241824, pub. date. Sept. 1997.

* cited by examiner

*Primary Examiner*—Marianne Padgett
(74) *Attorney, Agent, or Firm*—Howard & Howard

(57) ABSTRACT

The invention concerns a device and a method for coating and/or surface modification of objects in a vacuum using a plasma, where there is the possibility of coating or modifying variform objects on all sides without a large expense for plant or process engineering being necessary. In accordance with the invention, a box structure (1) of an electrically conductive material that forms a vacuum chamber or can be inserted into a vacuum chamber is used. Objects (2) can be introduced into the box structure to at least one closable opening (8) at a distance from the inner wall. In addition, there are at least one opening (3) for supply and at least one opening (4) for removal of the operating gas as well as one opening (6,6') for introduction of energy for generation of a glow discharge and the box structure (1) has a potential that is electrically negative with respect to the plasma generated by the glow discharge.

16 Claims, 1 Drawing Sheet

DEVICE AND METHOD FOR THE VACUUM PLASMA PROCESSING OF OBJECTS

BACKGROUND OF THE INVENTION

1. Field of the Invention

The invention concerns a device and a method for coating and/or surface modification of objects in a vacuum using a plasma, in which there is the possibility of coating or modifying variform objects on all sides without a large expenditure for plant and process engineering being required. Besides coating or modification, it is also easily possible to conduct cleaning, etching and/or activation to improve, for example, the adhesion of coatings that may be subsequently applied.

Besides the modification of regions of objects that are close to the surface it is also possible by means of the invention to apply particularly microscopically dense metal coatings or compound layers that have low roughness.

The deposition of coatings on objects using a planar direct current magnetron is known from G. Kienel, Vacuum Coating [in German], Volume 2, VD1 Verlag GmbH, Düsseldorf, 1993, pp. 160–161.

Such a solution, however, enables the coating of objects that is to be carried out spatially in three dimensions only if the objects are moved at the same time, which can be realized only with great difficulty and at great costs, if at all, especially in the vacuum chambers that are required for this. If such objects have undercut areas, these normally cannot be coated.

2. Description of the Prior Art

In addition, harmful effects from residual gases have to be avoided by producing a high vacuum, which either greatly increases the time needed to produce the vacuum, or requires costly vacuum locks or costly high vacuum pumps.

Another disadvantage is that larger surfaces are parasitically coated, which leads to high losses of the coating material, which has an adverse effect in particular for expensive coating materials such as noble metals. In addition, costs for cleaning are higher because of the parasitic coatings in the chamber and the elements found there.

The amount of coating material that can be applied to the corresponding objects is correspondingly limited, so that a relatively frequent interruption of the coating process is necessary for the necessary changeover of the target.

Thus, it is a task of the invention to propose a device and a corresponding method with which surface modification and/or coating of objects of quite various designs on all sides and optionally even on undercut surface regions can be achieved at low cost for plant engineering process engineering and other expenses.

SUMMARY OF THE INVENTION AND ADVANTAGES

The device in accordance with the invention can correspondingly be modified for the coating, already mentioned at the start in the description, of objects with metals, metal alloys or various metal compounds like metal nitrides or metal oxides or alternatively and cumulatively for this on the surfaces, so that, for example, the adhesion properties of coatings that are to be applied later can be improved. Here a box structure, which can have, for example, the form of a rectangle, cube or cylinder of an electrically conductive material is used. The box structure can, by itself, represent a vacuum chamber, which is used by connecting the appropriate pumps and valves in combination, with the technical elements to be used subsequently. However, there is also the possibility of inserting such a box structure into a traditional vacuum chamber and operating there in accordance with the invention.

DETAILED DESCRIPTION OF THE INVENTION

Figure 1:
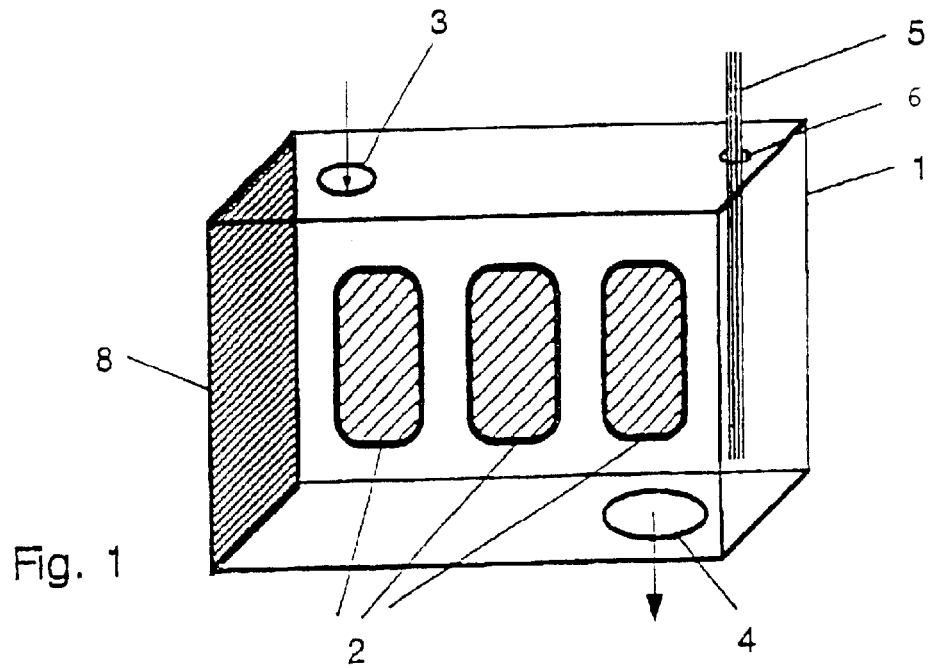
FIG. 1 shows an example of a device in accordance with the invention with an inserted electrode for plasma generation.

FIG. 1 represents a box structure 1 with rectangular cross section. An end face 8 is formed as an opening through which objects 2 are introduced and can be removed. Opening 8 can, as shown, be reclosed. The operating gas can be introduced into the flat structure 1 through opening 3 and can be removed again through the larger and diametrically oppositely arranged opening 4.

Electrode 5, which is in this case connected as an anode, is inserted via an additional opening 6'. Between anode 5 and the box structure 1 there is insulation, not shown, so that the potentials are separate from one another.

The objects that are to be coated or modified are inserted into the box structure, namely so that direct contact between the objects and the inner wall is avoided and, apart from that, an electrical insulation is used as support for the objects. The objects can be inserted into the box structure preferably via various openings, so that the objects are surrounded on all sides. The box structure can, however, also consist of two parts, with one part forming a cover that can be positioned on the lower part.

At least the inner wall should consist of a material that is suitable for the coating. Of course, it is also possible for the entire box structure to be formed from a material suitable for the coating or for flat targets of a coating material to be arranged on the inner walls of the box structure.

Figure 2:
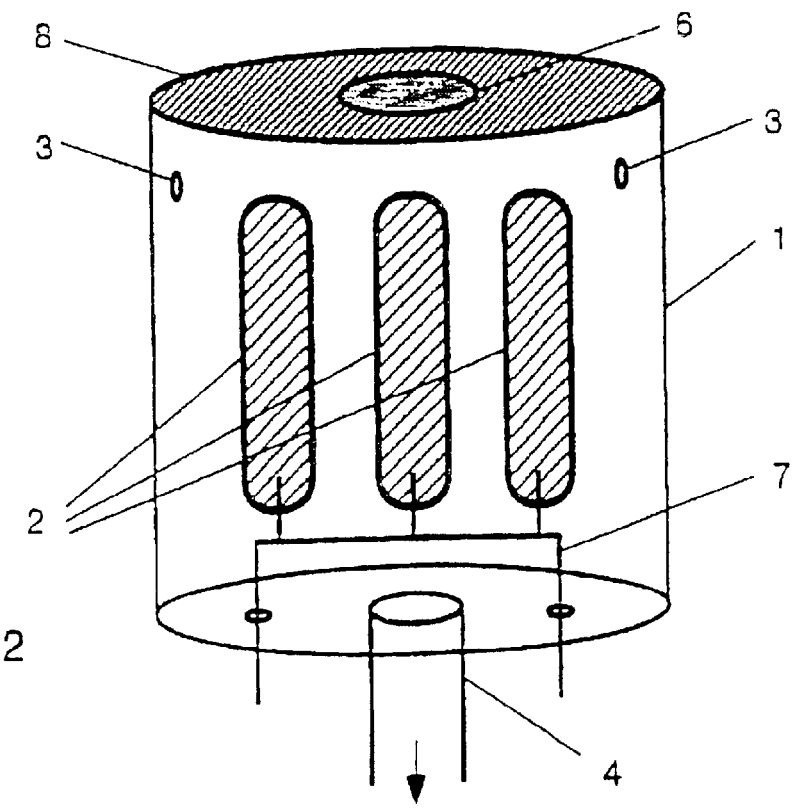
FIG. 2 shows a second example of a device in accordance with the invention with an opening through which microwaves can be directed for plasma generation.

FIG. 2 shows as a cylindrical box structure 1 in which several objects 2 are arranged on a support 7 insulated from the box structure 1. The upper face is again formed as a cover 8, which can be removed and reattached.

There is an opening 6 in cover 8, through which microwaves can be directed into the interior of the box structure 1 and a plasma can be generated.

In this example there are two openings 3 in the outer jacket surface, through which operating gas can be introduced into the interior of the box structure 1. The gas can be removed through opening 4, which in this example is combined with a support, from the box structure 1.

In addition, openings for feed and withdrawal of the working gas as well as at least one opening through which the energy to produce a glow discharge can be introduced into the box structure are necessary.

For the modification or coating the box structure is charged to an electrically negative potential with respect to the plasma generated with the glow discharge.

The plasma generation that is brought about by a glow discharge can take place in various ways. For this there is on the one hand the possibility of inserting an electrode through an opening into the interior of the box structure and supplying direct or alternating current to the electrode. If direct current is supplied, the electrode is connected as the anode. The correspondingly supplied alternating current can be low frequency, medium frequency or high frequency.

Another possibility for generating the plasma is to direct microwaves through an opening into the interior of the box structure and thus to generate the plasma.

Since the box structure has a negative electrical potential compared to the plasma, material can be stripped at the inner surface through the appearance of high energy positive ions from the plasma (cathode sputtering), and this material is then deposited on the objects. However, a sufficient difference of potential must be established for this. If an appropriate potential difference has not been reached, no or nearly no material will be stripped away and there will only be a modification in the subsurface region of the objects held in the box structure. The objects can consist of quite various materials such as metal, plastic or ceramic.

By simply increasing the difference of potentials between the box structure and the plasma it is possible to initiate coating of the objects, in addition to modification. Through the appropriate stripping of material at all inner walls of the box structure coating of any three dimensionally shaped object on all sides is possible without additional manipulation of the objects and it is also possible to coal undercut regions, with increased working pressure, which leads to dispersed distribution of the stripped material components, having a favorable effect. Thus, uniform and nearly simultaneous modification and/or coating of objects can be achieved.

The coating material that is not directly deposited on the surface of the object is essentially redeposited on the inner surface of the box structure and thus is not lost to the coating process. Since dispersed coatings are deposited only on relatively small internal fittings in the box structure such as, for example, the support on which the objects are held, the cleaning cost is reduced considerably compared to the traditional solutions.

The adsorbate layers that, as is well known, form in such processes and have an adverse effect on the quality of the layer and layer adhesion in vacuum coating processes through their desorption during coating can be counteracted very effectively through ion bombardment removal. For this the interior of the box structure can be cleaned relatively shortly before the actual coating with a low plasma power, low negative potential on the box structure and/or by providing an elevated operating pressure, so that no additional technical requirements have to be met to remove the adsorbate layers and the adsorbate after being separated can easily be drawn out with the operating gas.

With the device in accordance with the invention there is also the possibility of already removing a large proportion of the adsorbate layers before initiating the glow discharge and plasma generation with the introduction and evacuation of a clean dry operating gas during the evacuation phase. Relatively little operating gas is needed for this, since the box structure and its inner surface can be relatively small compared to the inner surface of the traditional vacuum coating chambers, for equal volumes of objects that are to be coated.

Through the ion bombardment the inner surface of the box structure can be heated in a simple manner and way and without additional technical cost, so that the desorption of the adsorbate layers can be considerably accelerated.

If the box structure is used in a larger vacuum chamber and accordingly does not itself act as a vacuum chamber, there still remains the effect that the gas flow in the box structure cannot force any desorbable gases from the walls of the larger vacuum chamber into the box structure due to the relatively small free cross section of its openings.

Since the cleaning of adsorbate layers by ion bombardment and gas flow in the interior space of the box structure is very effective, and the necessary operating pressure during the actual coating lies in the range of a coarse/fine vacuum, a high vacuum pump with the correspondingly high cost is not necessary.

Compared to the known solution of coating with magnetron sources, the solution in accordance with the invention offers another advantage, which is that considerably more coating material is available than is the case with the targets that are used in the known solution. Since the entire inner surface of the box shaped material consists of coating material, or appropriately dimensioned flat targets of such a coating material are arranged there, the stock of coating material is considerably larger and the process has to be interrupted correspondingly less often for recharging with coating material. In addition, the plasma parameters do not unduly change even when severe stripping of coating material has occurred. In addition, there is no limitation due to thermal resistance caused by a great target thickness.

The box structure can, in combination with the pressure of the operating gas, be dimensioned so that the discharge produced as a consequence of the introduced energy has the character of a hollow cathode glow discharge, so that a particularly high plasma density and accordingly a high coating rate can be achieved without expensive permanent magnets being necessary, as is the case with magnetrons. Here the condition pressure·tube inside diameter=133.3 Pa·cm with a tolerance range of a maximum of 13.33–133.3 Pa·cm that was mentioned by M. v. Ardenne in Effects of Physics [in German], Verlag harry Deutsch, Thun, Frankfurt/Main, 1990, can be correspondingly taken into consideration for the development of a hollow cathode discharge when the relevant clear width of the box structure is used for the tube inside diameter.

Since in accordance with the invention modification and coating can be carried out at relatively low temperatures, there is also the possibility, and this has a very favorable effect, that the box structure can be provided with cooling, preferably water cooling.

As already noted, the difference of potentials between the generated plasma and the box structure can be specifically affected and can be established in the range between 100 to 1000 V. Here the smaller voltage values are sufficient for modification and the higher voltage values are necessary for applying a coating.

The pressure in the box structure can be specifically established in the range between $10^{-3}$ to 10 mbar.

The opening for withdrawal of the operating gas has a size between a few cm$^2$ up to about 100 cm$^2$ and it is a good idea to dimension the other openings in the box structure so that their sum is less than the size of the withdrawal opening.

The box structure can have a clear width in the range between 1 cm and 1 m and should have a size at least 1.2 times that of the objects and should be a maximum of 10 times as large as the objects. The objects that are to be modified or coated should fill the interior of the box structure to a volume of about 0.1% to 30%. The objects in the box structure should be electrically isolated from the structure, for example on one or more supports, and should have a distance of at least 0.1 to a maximum of 10 cm from the inner wall of the box structure.

Various metals can be used, for example, aluminum, titanium, or alloys of these. However, it is also possible to use metal compounds such as titanium nitride or indium-tin oxide.

The operating gas, especially for flushing and cleaning, can be a clean dry inert gas, for example argon. However, an operating gas mixture of an inert gas and a reactive gas can be used for coating. One such operating gas is, for example, argon and nitrogen, so that nitride layers can be deposited on the objects.

The gas flow can be adjusted to a minimum of 10 cm$^3$/min[STP] (cubic centimeters per minute at standard temperature and pressure) and a maximum of 1000 cm$^3$/min [STP].

If only a very small coating or no coating at all is intended to be applied the potential difference between the plasma and the box structure should be set to the under 200 V and/or the pressure should be increased by at least a factor of three. With adjustment of this kind a surface modification, as already noted in general, can be carried out.

The device in accordance with the invention can also be used to produce composite structures. For this it is provided that a solid powder is supplied through one of the openings that are present or through an opening specifically made for this. It is also possible to place the solid powder in the device in a container. The particles of the solid powder preferably have a size from $10^{-4}$ to $10^{-9}$ m. Basically all known hard materials are possibilities as solid particles. Examples are high-melting metal oxides like corundum or titanium oxide. Diamond graphite or nitrides can also be used. In accordance with the method, when the powder is introduced via an opening, it is mixed into the inert gas stream. If the powder is supplied in a container, automatic turbulent mixing takes place due to the applied vacuum. The particles are then deposited on the surface that is to be coated.

The mode of operation in accordance with the invention will be described first below, in general form and then in more detail using two specific examples.

After putting the objects in the box structure, the box structure or the surrounding vacuum chamber is evacuated out by means of a vacuum pump aid at the same time or shortly afterwards flushing with the operating gas is carried out.

If a sufficiently low pressure (1–10 mbar) has been achieved, the box structure is charged to a negative potential with respect to the plasma and the glow discharge is initiated by the supply of energy. The ion-supported desorption of the adsorbate layers takes place by means of this.

After sufficient cleaning the pressure is reduced to a pressure in the range between 0.001 and 1 mbar by reducing the feed of operating gas and the potential difference between the box structure and the plasma is increased. This can take place, for example, by increasing the negative potential, thus a higher negative voltage is supplied to the box structure. Due to this, material of the coating material is stripped from the inner wall of the flat structure and the objects in the structure are correspondingly coated. In each case according to the coating to be applied a pure inert gas or an inert gas-reactive gas mixture can be used as the operating gas. The fraction of reactive gas, however, must be established in correspondence with the desired layer structure.

Then the glow discharge can be switched off, the supply of operating as in the pump disconnected and the vacuum chamber or the box structure flooded and after opening the box the modified or coated objects are removed.

The following Examples 1 and 2 are intended to describe on the one hand coating of objects with copper and on the other coating with titanium nitride in more specific detail.

EXAMPLE 1

The objects are put into the box structure, which is shaped as a tube, is situated in a vacuum vessel, and consists of block copper. For evacuation of the vacuum vessel the vacuum pump is connected. At the same time flushing with argon at about 100 cm$^3$/min[STP] is carried out.

Upon reaching a pressure of 5 mbar the box structure is charged to a negative potential of 300 V compared to a rod shaped anode inserted into the box structure and the glow discharge is initiated. This causes the ion-supported desorption of the adsorbate layers from the inner wall of the box structure.

After sufficient cleaning the pressure is reduced to the operating pressure of 0.5 mbar by reducing the feed of gas and the potential of the box structure is set to –500 V, so that coating of the objects with copper takes place.

After 10 min coating time the glow discharge is switched off by disconnecting the supply of current and the argon supply is turned off. The pump is disconnected and the box structure is aerated. The vacuum vessel and box structure are opened and the coated objects are removed.

EXAMPLE 2

The objects are put into the box structure. The box has the shape of a rectangular parallelepiped, consists of aluminum and is itself the vacuum vessel, which is coated nearly completely on its inside with titanium sheets ("targets"). The box structure has a short tubular stub in its wall, to which a microwave source is connected.

The vacuum pump is switched on for evacuation of the box. Shortly after that argon is supplied for flushing at about 300 cm$^3$/min[STP]. Upon reaching a pressure of 10 mbar the box structure is charged to a negative potential of 250 V and the glow discharge is initiated by turning on the microwave source.

After 3 min cleaning the pressure is reduced to 0.3 mbar by reducing the gas supply, and the objects are supplied with a potential of –500 V, through which surface cleaning takes place. Then 10% nitrogen is added to the argon and the potential of the box structure is set to –600 V, so that coating of the objects with titanium nitride takes place.

After 15 min of coating the glow discharge is turned off and the operating gas supply stopped. The pump is isolated by a valve and the box is aerated. The box is opened and the objects are removed.

The organization of possible examples of a device in accordance with the invention is described in more detail below.

Here:

FIG. 1 shows an example of a device in accordance with the invention with an inserted electrode for plasma generation, and FIG. 2 shows a second example of a device in accordance with the invention with an opening through which microwaves can be directed for plasma generation.

FIG. 1 represents a box structure 1 with rectangular cross section. An end face 8 is formed as an opening through which objects 2 are introduced and can be removed. Opening 8 can, as shown, be reclosed. The operating gas can be introduced into the flat structure 1 through opening 3 and can be removed again through the larger and diametrically oppositely arranged opening 4.

Electrode 5, which is in this case connected as an anode, is inserted via an additional opening 6'. Between anode 5 and the box structure 1 there is insulation, not shown, so that the potentials are separate from one another.

FIG. 2 shows a cylindrical box structure 1, in which again several objects 2 are arranged on a support 7 insulated from the box structure 1. The upper face is again formed as a cover 8, which can be removed and reattached.

There is an opening 6 in cover 8, through which microwaves can be directed into the interior of the box structure 1 and a plasma can be generated.

In this example there are two openings 3 in the outer jacket surface, through which operating gas can be introduced into the interior of the box structure 1. The gas can be removed through opening 4, which in this example is combined with a support, from the box structure 1.

What is claimed is:

1. A device for the plasma treatment of objects in a vacuum comprising;

a box-shaped structure of an electrically conductive material defining a vacuum chamber to which a vacuum may be applied, a support for supporting and electrically insulating the objects from the surrounding box-shaped structure, said box-shaped structure having inner walls completely surrounding said support on all sides and including at least one opening that can be opened for ingress and egress of objects and closed whereby an object to be coated is moved through said opening and placed on said support out of direct contact with said inner walls of said box-shaped structure, said box-shaped structure including a working gas inlet for supplying a working gas and a working gas outlet for discharging the working gas, said box-shaped structure including an energy opening for introducing energy to create the plasma, all of said inner walls of said box-shaped structure having an electrical charge opposite to the charge of the plasma whereby all of said inner walls of the box-shaped structure act as an electrode completely surrounding the support whereby objects on the support are out of direct contact on all sides to the inner walls of the box-shaped structure, all of said inner walls of said box shaped structure presenting a coating material for removal from the structure and deposition on the objects.

2. A device as set forth in claim 1 including an energy electrode extending into said chamber through said energy opening and electrically insulated from said box-shaped structure for introducing the electrical energy to generate the plasma.

3. A device as set forth in claim 1 including a microwave generator for introducing microwaves through said energy opening to generate the plasma in said vacuum chamber.

4. A device as set forth in claim 1 wherein said support provides a predetermined electrical potential to be applied to the objects.

5. A device as set forth in claim 1 including a cooling system for cooling the box-shaped structure.

6. A device as set forth in claim 1 wherein said vacuum chamber has a width that is at least one and two tenths (1.2) times greater than the width in the same direction of said support.

7. A device as set forth in claim 1 wherein said gas outlet has a cross-sectional area greater than the sum of the cross-sectional areas of said gas inlet and said energy opening.

8. A device as set forth in claim 1 wherein said box-shaped structure comprises at least in part a metal.

9. A method for the plasma treatment of objects comprising the steps of;

supporting objects in a vacuum chamber defined by an electrically conductive box-shaped structure having inner walls completely surrounding and spaced from the objects on all sides for electrically insulating the objects from the inner walls of the box-shaped structure, applying a vacuum to the vacuum chamber surrounding the objects, generating a plasma in the vacuum chamber having an electrical potential and applying an opposite electrical potential to all of the inner walls of the entire box-shaped structure, placing a coating on all of the inner walls said box-shaped structure in the vacuum chamber defined thereby, and removing the coating from all of the inner walls of the box-shaped structure and depositing the coating material on the objects.

10. A method as set forth in claim 9 including negatively charging the box-shaped structure.

11. A method as set forth in claim 9 including supplying a reactive gas to the vacuum chamber while generating the plasma.

12. A method as set forth in claim 9 including introducing a powder into the vacuum chamber and depositing the powder material into the objects.

13. A method as set forth in claim 9 including establishing an electrical potential difference between the entire box-shaped structure and the plasma in the range of 100 to 1000 volts.

14. A method as set forth in claim 9 including introducing a working gas at the rate of 10 to 1000 cubic centimeters per minute.

15. A method as set forth in claim 9 including establishing an electrical potential difference below 200 volts between the box-shaped structure and the plasma.

16. A method as set forth in claim 9 including establishing a hollow cathode discharge in the vacuum chamber.

* * * * *